United States Patent
Papli

(10) Patent No.: US 11,875,305 B2
(45) Date of Patent: *Jan. 16, 2024

(54) VIDEO TRAINING DATA FOR MACHINE LEARNING DETECTION/RECOGNITION OF PRODUCTS

(71) Applicant: Salesforce, Inc., San Francisco, CA (US)

(72) Inventor: Alex Papli, Melbourne (AU)

(73) Assignee: Salesforce, Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/931,854

(22) Filed: Sep. 13, 2022

(65) Prior Publication Data

US 2023/0143722 A1    May 11, 2023

Related U.S. Application Data

(63) Continuation of application No. 16/794,086, filed on Feb. 18, 2020, now Pat. No. 11,475,241.

(51) Int. Cl.
| | |
|---|---|
| G06Q 10/087 | (2023.01) |
| G06N 20/00 | (2019.01) |
| G06T 7/70 | (2017.01) |
| G06V 20/40 | (2022.01) |
| G06F 18/214 | (2023.01) |
| G06F 18/211 | (2023.01) |
| G06V 10/764 | (2022.01) |
| G06V 10/774 | (2022.01) |
| G06V 10/82 | (2022.01) |
| G06F 30/10 | (2020.01) |

(52) U.S. Cl.
CPC ......... *G06Q 10/087* (2013.01); *G06F 18/211* (2023.01); *G06F 18/214* (2023.01); *G06N 20/00* (2019.01); *G06T 7/70* (2017.01); *G06V 10/764* (2022.01); *G06V 10/774* (2022.01); *G06V 10/82* (2022.01); *G06V 20/40* (2022.01); *G06V 20/46* (2022.01); *G06F 30/10* (2020.01); *G06T 2207/10016* (2013.01); *G06T 2207/20081* (2013.01)

(58) Field of Classification Search
CPC ............... G06Q 10/087; G06T 7/70; G06T 2207/10016; G06T 2207/20081; G06N 20/00; G06V 20/46; G06V 10/82; G06V 20/40; G06V 10/774; G06V 10/764; G06F 18/211; G06F 18/214; G06F 30/10
USPC ......................................................... 382/159
See application file for complete search history.

(56) References Cited

U.S. PATENT DOCUMENTS

| | | | |
|---|---|---|---|
| 7,227,893 B1 | 6/2007 | Srinivasa et al. | |
| 9,665,800 B1 | 5/2017 | Kuffner, Jr. | |
| 10,860,836 B1* | 12/2020 | Tyagi | G06N 3/084 |

(Continued)

*Primary Examiner* — Michael R Neff
(74) *Attorney, Agent, or Firm* — Polygon IP, LLP

(57) ABSTRACT

Described herein are systems, apparatus, methods and computer program products configured for image detection/recognition of products. The disclosed systems and techniques utilize video data to provide the necessary number of images and view angles needed to train a machine learning product detection/recognition system to recognize a specific product within later provided images. In various embodiments, a user may provide video data and the video data may be transformed in a manner that may aid in training of the machine learning system.

20 Claims, 11 Drawing Sheets

(56) References Cited

U.S. PATENT DOCUMENTS

| | | |
|---|---|---|
| 10,891,518 B1 | 1/2021 | Joshi et al. |
| 11,475,241 B2 * | 10/2022 | Papli .................. G06N 20/00 |
| 2007/0031037 A1 * | 2/2007 | Blake .................. G06V 10/28 |
| | | 382/173 |
| 2020/0210768 A1 | 7/2020 | Turkelson et al. |
| 2020/0302646 A1 | 9/2020 | Jeong et al. |
| 2021/0209734 A1 | 7/2021 | Simhadri et al. |
| 2021/0256307 A1 | 8/2021 | Papli |

* cited by examiner

VIDEO TRAINING DATA FOR MACHINE LEARNING DETECTION/RECOGNITION OF PRODUCTS

CROSS-REFERENCE TO RELATED APPLICATIONS

This patent application is a continuation of and claims priority to U.S. patent application Ser. No. 16/794,086 by Papli, titled "VIDEO TRAINING DATA FOR MACHINE LEARNING DETECTION/RECOGNITION OF PRODUCTS," filed Feb. 18, 2020. U.S. patent application Ser. No. 16/794,086 is hereby incorporated by reference in its entirety and for all purposes.

COPYRIGHT NOTICE

A portion of the disclosure of this patent document contains material which is subject to copyright protection. The copyright owner has no objection to the facsimile reproduction by anyone of the patent document or the patent disclosure as it appears in the United States Patent and Trademark Office patent file or records but otherwise reserves all copyright rights whatsoever

FIELD OF TECHNOLOGY

This patent document relates generally to object detection/recognition and more specifically to machine learning techniques for object detection/recognition.

BACKGROUND

Machine learning systems typically require many hundreds of images of a subject to properly train an object detection/recognition system to detect and/or recognize the object. Requiring hundreds of images of each object for the training process results in a time consuming process that is impractical for many applications, particularly for entities with limited resources that are looking to use image detection/recognition for cataloguing of products. This is especially true since the entity may wish to catalogue hundreds or thousands of products.

BRIEF DESCRIPTION OF THE DRAWINGS

The included drawings are for illustrative purposes and serve only to provide examples of possible structures and operations for the disclosed inventive systems, apparatus, methods and computer program products for training of a machine learning object detection/recognition system. These drawings in no way limit any changes in form and detail that may be made by one skilled in the art without departing from the spirit and scope of the disclosed implementations.

DETAILED DESCRIPTION

Figure 1:
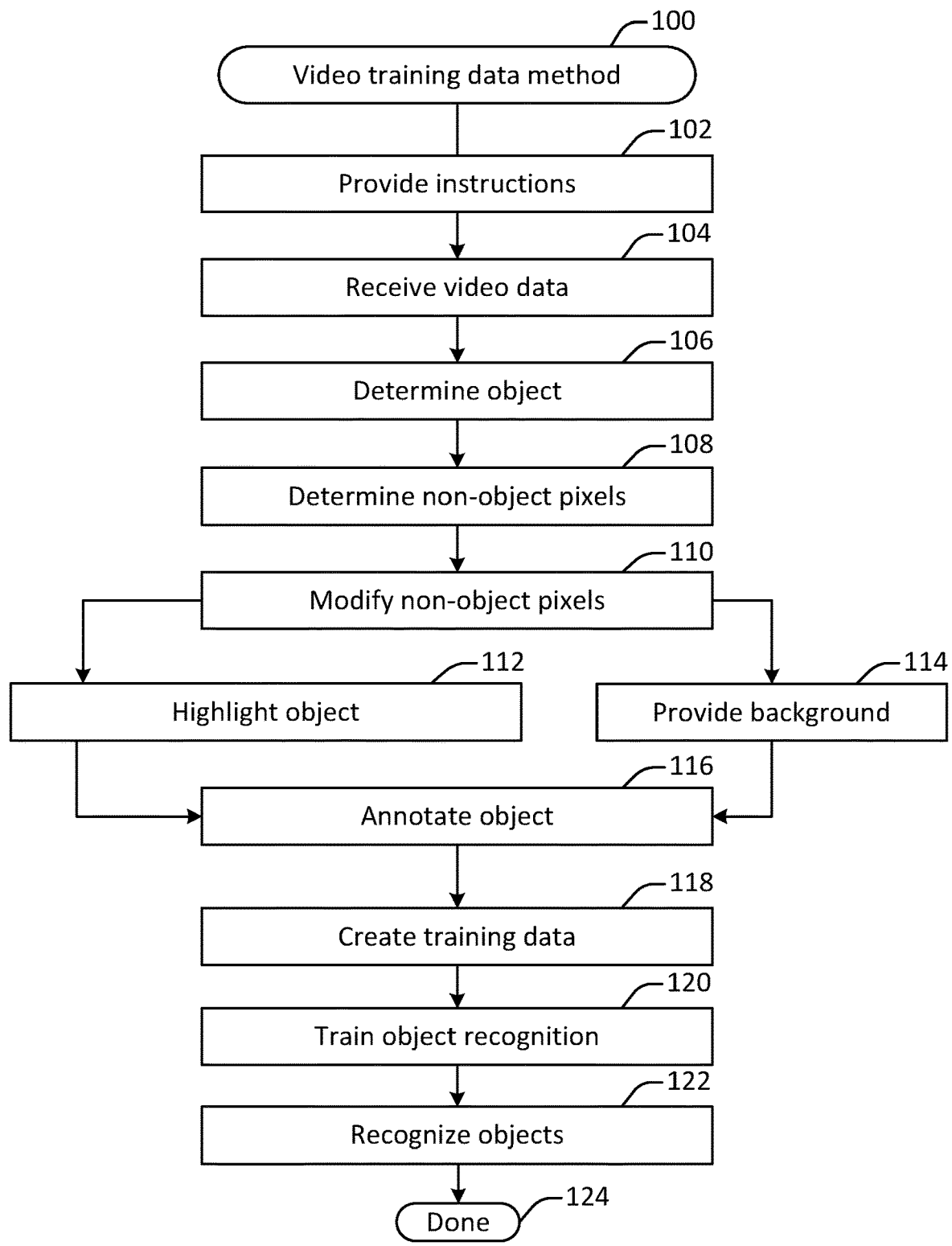
FIG. 1 illustrates an example method for obtaining, creating, and modifying video data for use in machine learning object detection/recognition training, performed in accordance with one or more embodiments.

Some implementations of the disclosed systems, apparatus, methods and computer program products are configured for image detection/recognition of products. Specifically, the disclosed systems and techniques utilize video data to provide the necessary number of images and view angles needed to use as training data for a machine learning product detection/recognition system. The frames of the video data provide the required number of images and view angles of a product to train the machine learning product detection/recognition system to recognize and/or detect the product within later provided images. As such, the video data (in some cases, after processing as described herein) is used to train the product detection/recognition system to recognize and/or detect the product within images and provide data for secondary processing (e.g., cataloguing, inventory counting, lead enhancement) to users of the product detection/recognition system.

As used herein, "product detection" refers to detecting the presence of a product (e.g., that the item detected is one of a plurality of products to be recognized) while "product recognition" refers to recognizing the specific identity of product. For the purposes of this disclosure, references to "product detection" or "product recognition" are understood to each refer to both product detection and recognition and are, thus, used interchangeably as such.

As such, the disclosed systems and techniques allow for filming of a product using video capturing equipment (e.g., a video camera or a consumer grade electronic device such as an iPhone® or other smart phone) to create video data instead of capturing hundreds of different still images of the product. The video data is then used for image detection/recognition training. Typically, video may be captured at 30 frames per second. As such, in a certain example, a 20 second video may be obtained that covers many angles of a product. Such a 20 second video will provide 600 frames (e.g., images), which may be numerically sufficient for image detection/recognition training and should result in accurate results.

The disclosed systems and techniques accordingly allow for filming of a product by moving a video camera (e.g., of an electronic device such as a smartphone) around the product (e.g., in an orbital circular motion, conical circular motion (e.g., with a vertical component), or another type of motion to capture the object from a plurality of visible angles while, for example, maintaining the object substantially within the center of the frame). In certain embodiments, the product may be filmed in lighting conditions that will be experienced in practice (e.g., when later used to capture images of products for processing). After filming of the product, the individual frames of the video data may be extracted. The individual frames may then be grouped, tagged (e.g., the product within the frames may be identified), and submitted to a machine learning platform for image processing (e.g., to be used as training data).

Rose is a sole proprietor of an electronic widget shop. On weekends, Rose will typically canvas other widget shops to compare inventory and pricing. In order to aid in her canvasing, Rose downloads a product recognition program called ImageMemory onto her smartphone. However, the current iteration of ImageMemory requires a user to upload hundreds of different views of a product to train Image-Memory to detect and/or recognize the product. Rose, being a sole proprietor, finds that she is unable to provide the views and, thus, is unable to use ImageMemory.

Months later, ImageMemory is updated to allow for video data to be used as training data. Rose, upon learning of the update to ImageMemory, films 15 second videos of all her products. The videos are then transformed according to ImageMemory's algorithm and ImageMemory is then trained to detect and/or recognize those products within photographs that Rose later obtains. Due to the ability for Rose to upload short videos for use as training data, Rose was able to take videos of all her products and upload them to ImageMemory's server in an afternoon. From then on, Rose is able to use ImageMemory for product recognition.

FIG. 1 illustrates an example method for obtaining, creating, and modifying video data for use in machine learning object detection/recognition training, performed in accordance with one or more embodiments. FIG. 1 illustrates video training data method 100 performed by a product detection/recognition system. In various embodiments, method 100 may be performed by a machine learning object detection/recognition system and/or by a separate system or application that prepares training data to train the machine learning object detection/recognition system. All or portions of method 100 may be performed by a service provider (e.g., a receiver of the video data) to prepare video data received from a user. The prepared video data may then be used as training data for a machine learning system to train the system to detect and/or recognize objects within further images. In various embodiments, the service provider may be associated with the machine learning system and may also train and/or operate the machine learning system. In other embodiments, the service provider may provide the training data to another party that trains and/or operates the machine learning system.

Method 100 starts with providing instructions to a user for obtaining video data of a product in optional block 102. The instructions may include, for example, various angles of the product that the video should obtain, any required movement for obtaining the video (e.g., rotating the camera and/or rotating the product), the minimum, recommended, and/or maximum video length, any background requirements, resolution requirements, frame rate requirements, and/or any other instructions. In certain embodiments, the instructions may be for the user to provide three-dimensional models instead of video (e.g., three-dimensional computer aided design models).

For the purposes of this disclosure, "video data" refers to both data of a product obtained through video as well as three-dimensional computer aided design models. While the current disclosure describes a technique for use with video data, it is understood that the techniques described herein may also be applied to computer aided design models.

The user may obtain the video data (or three-dimensional model data) as instructed and provide the video data. The data may be electronically communicated (e.g., through a wired and/or wireless data network) to the service provider. The system may receive the video data in block 104. In various embodiments, the video data may be received as, for example, .avi, .flv, .mpg, .mov. wmv, .mp4, or another format file. In various embodiments, the received video data may include a plurality of frames. The video data may be received with associated secondary files, such as files that include user comments. In certain embodiments, the user may highlight the object to be detected and/or recognized in one or more frames. In other embodiments, the user may not provide such highlighting of the object. If the data is one or more computer aided design models, the service provider may, upon receiving the data, manipulate the model (e.g., rotate, pan, zoom, or otherwise move the model) to obtain the requisite amount of views from the three-dimensional model.

After receiving the video data, the systems described herein may analyze the video data and transform and/or modify the video data. For example, in block 106, an object may be identified within the video data. The object may be identified through techniques such as analyzing the entirety of the video data and determining that the video data indicates a focus around the object (e.g., the video is rotated around the object), that certain portions of the video show typical backgrounds (e.g., a tabletop) while other portions show the object, or that the object may be identified from the secondary data (e.g., the secondary data may indicate where the object is within the frames). If the data received is a three-dimensional model, the model may automatically be determined as the object.

After identifying the object in block 106, non-object pixels may be determined in block 108. Non-object pixels may be any pixel within the frames of the video data that does not depict the object to be determined. Non-object pixels may, for example, be pixels depicting a background of the area that the object is placed within and/or an object that the object is placed on. In various embodiments, when the object is identified in block 106, all pixels that depict the object may be identified. Any pixel not within that group (e.g., not depicting the object) is then determined to be a non-object pixel.

After the non-object pixels are identified, the non-object pixels may be modified in optional block 110. Modifying the non-object pixels may include, for example, setting the pixel value (e.g., color) of the non-object pixels to one or more pre-determined pixel values. Doing so may then change the non-object pixels to a uniform background and/or setting.

The video data may then be modified to highlight and/or modify the object within the various frames of the video data in block 112. In various embodiments, the highlighting the object may include, for example, constructing a bounding box around the perimeter of the object, highlighting the object within the image frames, removing pixels that are determined to not be of the object, indicating the location of the object (e.g., the location of the pixels) in an associated file, and/or another such technique. In certain embodiments, the bounding box may be of a circular, triangular, rectangular, hexagonal, octagonal, or other geometric shape. The bounding box may contact the outer perimeter of the object or may be offset (e.g., spaced off of) the outer perimeter of the object.

Furthermore, the object and/or image may be modified to create a more realistic dataset (e.g., for training purposes such as adversarial training). Such modification of the object may include, for example, reducing the size of the object and/or the image, manipulating the object and/or the image to replicate different lighting conditions (e.g., darken for where the object may be placed under a shelf, addition of lens flare, different reflection conditions to simulate LED versus fluorescent lighting within a store), and/or obfuscating some or a portion of the image to simulate other objects blocking the full view of the object.

Additionally, in certain embodiments, the object and/or the frames of the video data received may each be used numerous times (e.g., to create datasets of different sizes or resolutions). As such, the source video data (e.g., frame or object image) may be cloned prior to modification to create such datasets, in order to preserve originality of the video data.

In block 114, the non-object pixels may be converted to one or more backgrounds. Such backgrounds may be typical backgrounds (e.g., store shelves, display cases, within packaging, on display shelves, and in other situations). Such backgrounds may be situations typically experienced and, thus, may aid in training the machine learning object detection/recognition system in detecting the object within typical situations. In various embodiments, multiple sets of image data may be created that each include different backgrounds. Such multiple sets of image data may aid in training the object detection/recognition system to detect the object in a variety of different backgrounds.

In various embodiments, certain blocks within method 100 may be optional. For example, blocks 102, 108, 110, 114, and 116 may be optional in various embodiments. Additionally, in certain embodiments, some or all of the techniques described in the various blocks may be performed in different orders. That is, in certain embodiments, block 114 may be performed after block 112 instead of concurrently with block 112.

The object may be annotated in block 116. Annotation of the object may include, for example, labeling of various features (e.g., object, background, and other features) within the modified image data. In certain embodiments, the annotation may be provided in a separate secondary file. Such a secondary file may identify the various areas of the image data (e.g., the pixel location of those areas) and annotate what the various areas show. The machine learning system may, through the use of the annotations, determine what is shown in the various areas within the image. The machine learning system may then be trained to identify the object based on the annotations identifying the object.

After the image data has been modified, training data may be created from the modified image data in block 118. The training data may include the modified image data and any associated secondary files. The training data may be packaged (e.g., zipped or otherwise packaged as one file) and communicated to the machine learning object detection/recognition system and the machine learning object detection/recognition system may be trained in block 120. After training, the machine learning object detection/recognition system may be configured to identify the object in various other images (e.g., images provided in the future from the user or from a different user) in block 122.

Figure 2A:
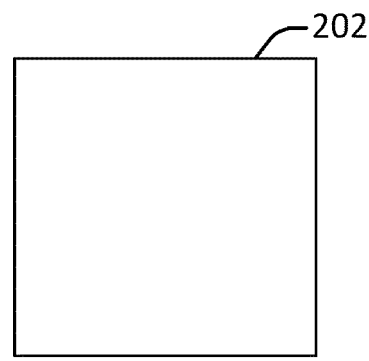
FIGS. 2A-C illustrate various views of an object shown in video data for use in machine learning object detection/recognition training, in accordance with one or more embodiments.
Figure 2B:
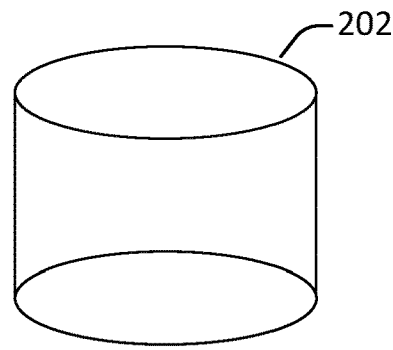
Figure 2C:
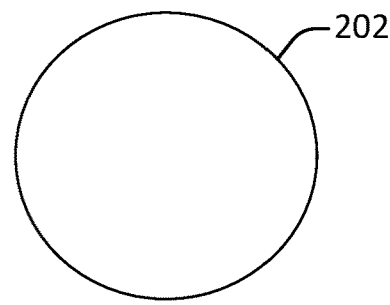

FIGS. 2A-C illustrate various views of an object shown in video data for use in machine learning object detection/recognition training, in accordance with one or more embodiments. FIGS. 2A-C illustrate three separate frames of video data obtained of object 202. FIG. 2A illustrates a side view of object 202. FIG. 2B illustrates a perspective view of object 202. FIG. 2C illustrates a top view of object 202. In certain embodiments, FIGS. 2A-C illustrate views of certain frames of a continuous video taken by rotating the camera around object 202 and/or rotating object 202 in view of the camera. As such, video data of object 202 may be taken that shows a rotation of object 202 from the view of FIG. 2A to the view of FIG. 2B to the view of FIG. 2C. In various other frames of the video data, object 202 may be filmed from other angles and may be moved through other views.

As such, in the example of Rose, ImageMemory's program may instruct Rose to rotate a camera to capture video data around objects that she wishes to train ImageMemory to detect/recognize and identify. Rose follows the instructions and proceeds to capture video data by rotating the camera around the object as instructed, capturing a plurality of different views of each product by rotating the camera.

FIGS. 3-7 illustrate various examples of video data depicting an object for use in machine learning object detection/recognition training, in accordance with one or more embodiments. FIGS. 3-7 illustrates the transformation of video data through the technique described in FIG. 1.

Figure 3:
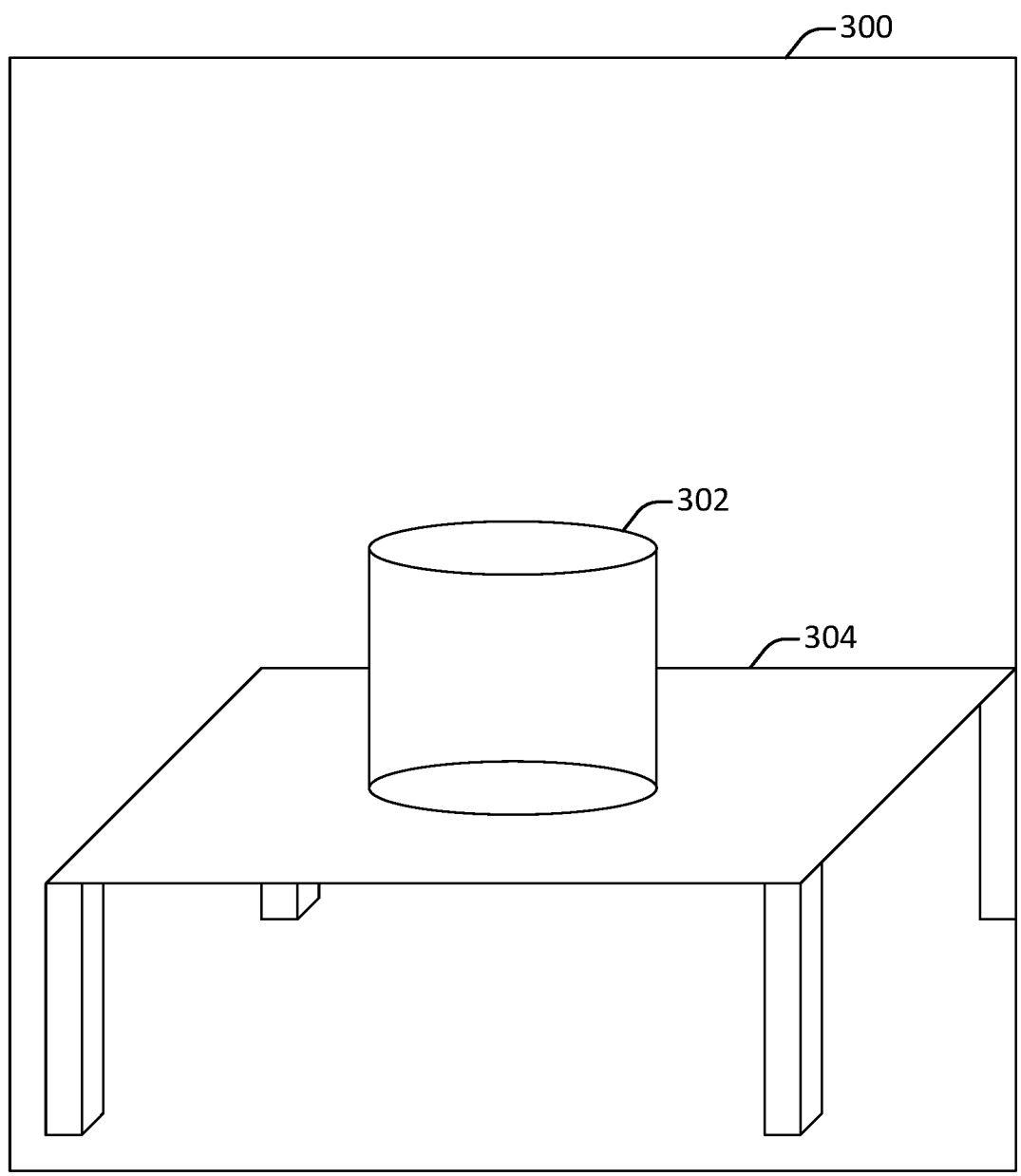
FIGS. 3-7 illustrate various examples of video data depicting an object for use in machine learning object detection/recognition training, in accordance with one or more embodiments.

In FIG. 3, image 300 may be obtained of object 302. Object 302 may be placed on table 304. The machine learning object detection/recognition system may identify object 302 within image 300 based on the techniques described herein. Most or all pixels that make up object 302 may be identified within image 300. Furthermore, table 304 may be identified as a table that is typically used in backgrounds. Table 304 may be determined to not be the object based on how commonly it appears in images and based on table 304 not being the focal point of the video data.

Thus, for example, Rose may obtain video data of a table top speaker. The video data may show the table top speaker (e.g., object 302) resting on table 304. FIG. 3 may illustrate one frame of the video data. The machine learning object detection/recognition system may detect and/or recognize the table top speaker based on object detection/recognition techniques and/or based on Rose identifying the object within one or more frames of the video data.

Figure 4:
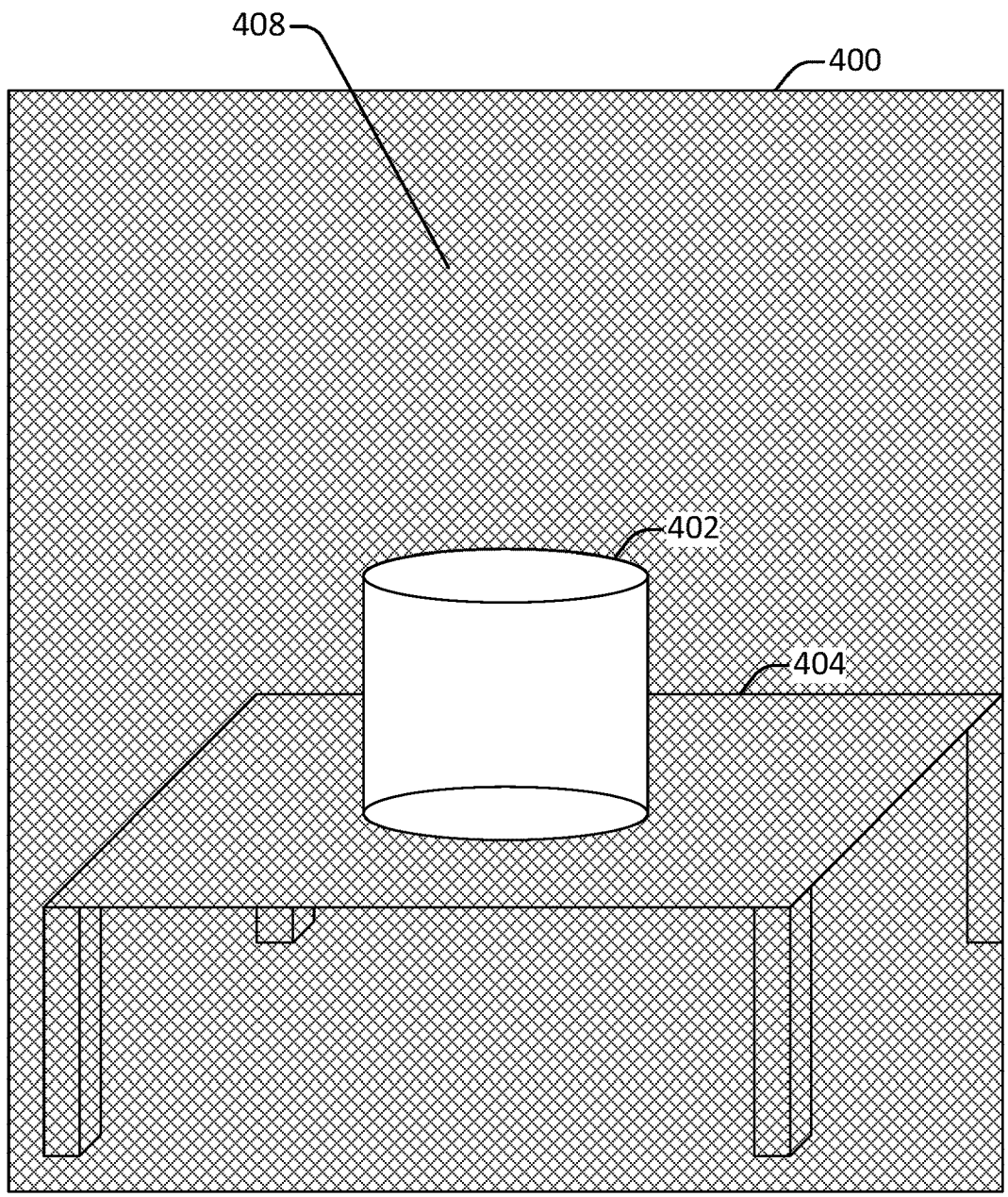
Figure 5:
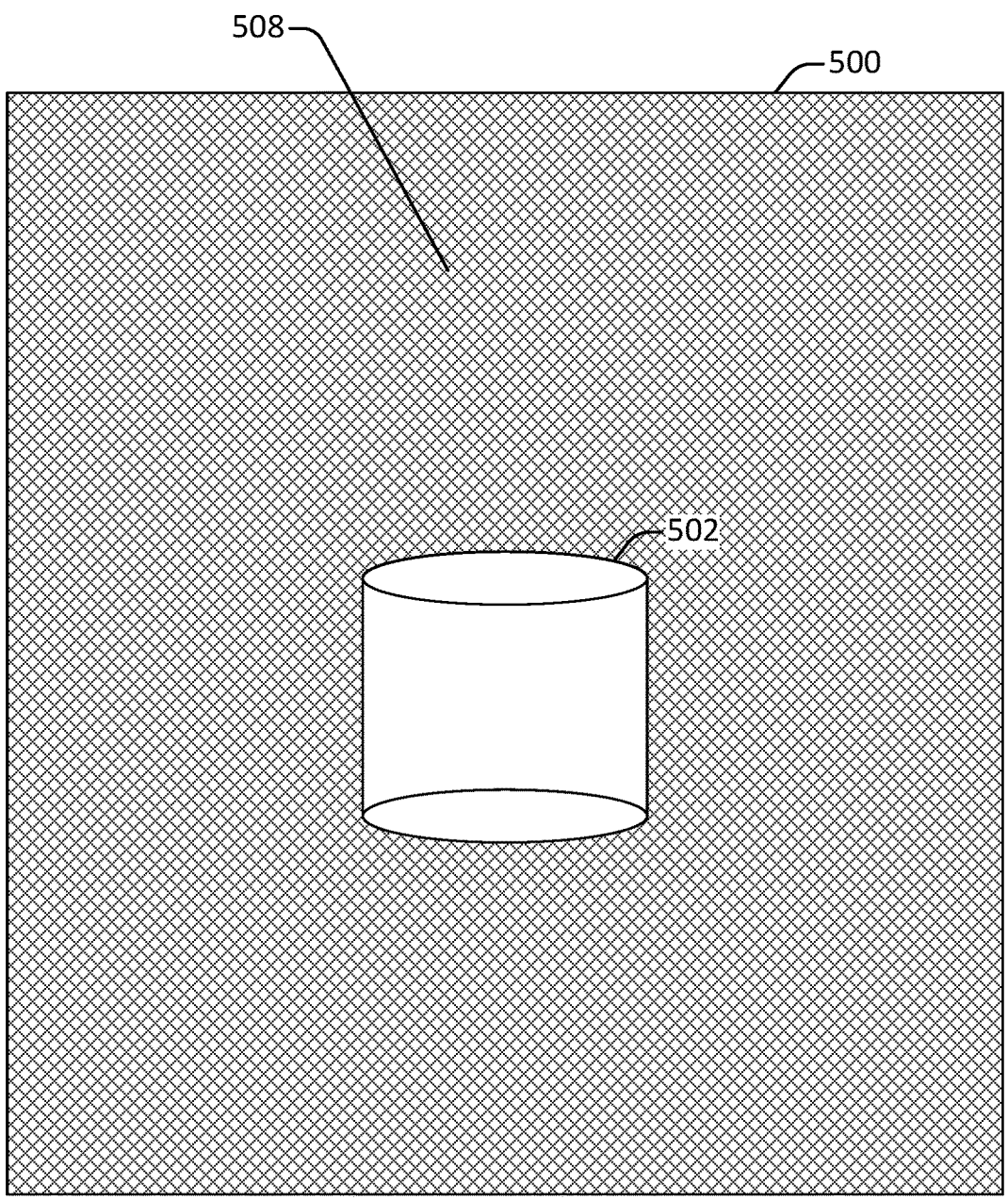
Figure 6:
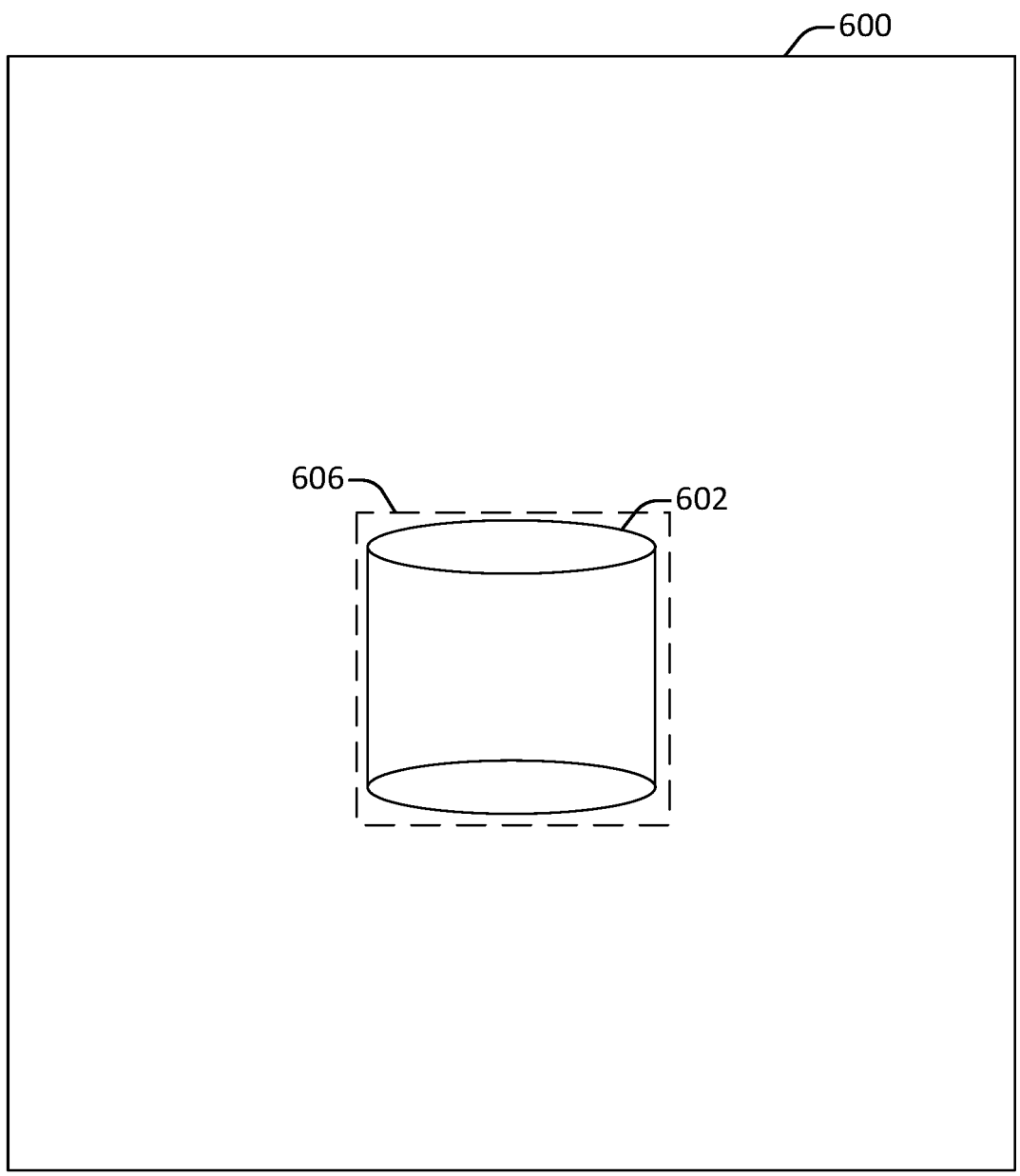

Based on identifying object 302 in FIG. 3, image 300 may be processed and transformed from image 300 to images 400 to 700 in FIGS. 4-7. Thus, objects 402 to 702 of FIGS. 4-7 may be the same object as object 302. Non-object pixels 408 are identified within image 400 in FIG. 4. As shown in FIG. 4, all pixels that are not of object 402 are identified as non-object pixels 408. Based on the identification in FIG. 4, in FIG. 5, non-object pixels 508 are transformed to a uniform pixel value. That is, for example, non-object pixels 508 may all be transformed to a pixel of the same color (e.g., white, black, grey, green, or another color, and/or setting the alpha channel value of the pixel to be transparent) or may be deleted or transformed into a pattern indicating that they are not object 502. As such, all non-object pixels 508 are transformed in a manner that indicates that they are not pixels of object 502.

After transformation of the non-object pixels, object 602 may be highlighted in image 600. Highlighting of object 602 may be performed by, for example, creating bounding box 606 around object 602. In various embodiments, bounding box 606 may be imposed on image 600 or the edges and/or dimensions and location of bounding box 606 may be indicated in a secondary file (e.g., as an annotation). Thus for example, the secondary file may indicate the center point of bounding box 606 and indicate the major and minor dimensions, as well as other dimensions, of bounding box 606 around the center point.

Figure 7:
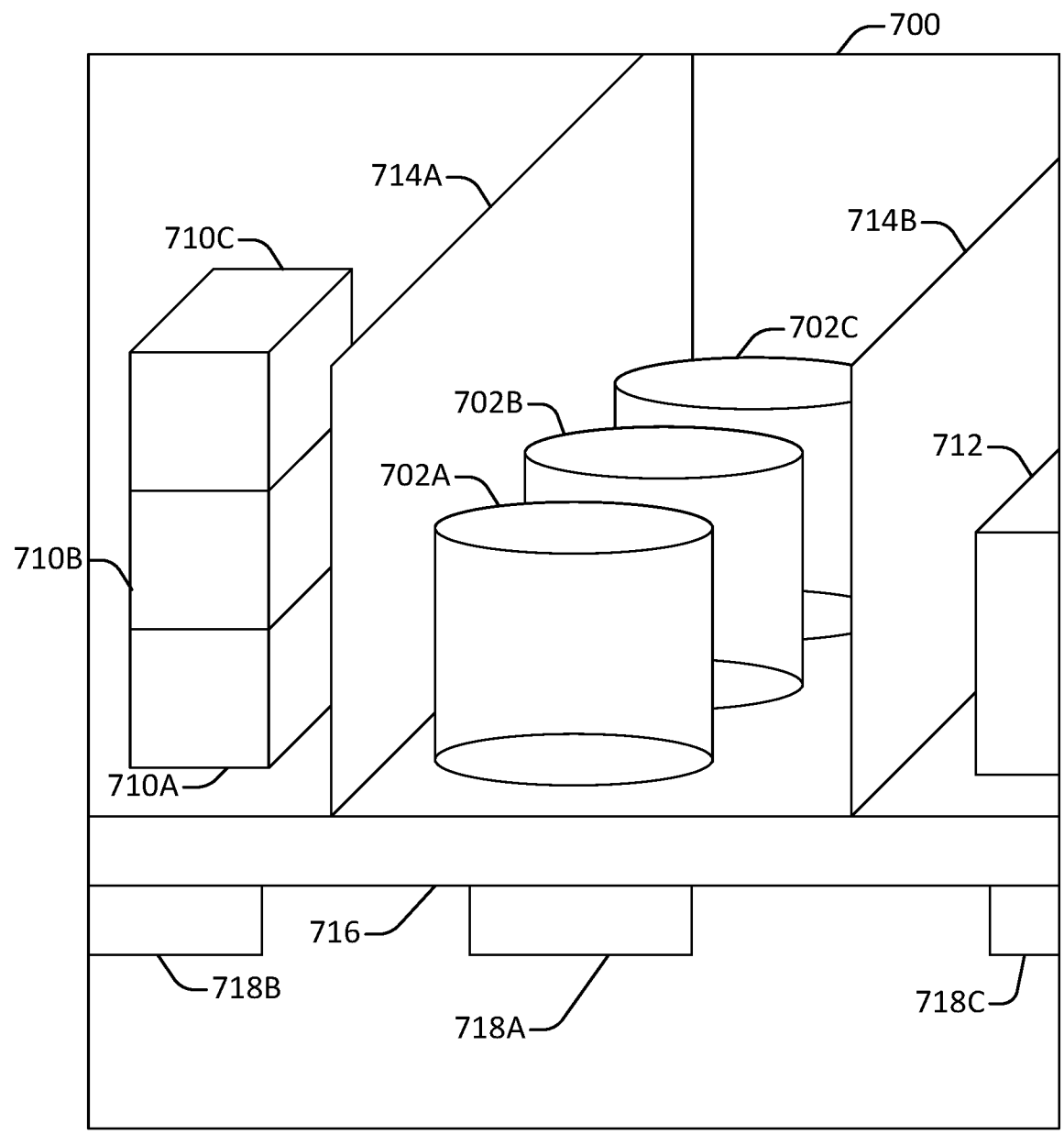

After determining bounding box 606 and, thus, highlighting object 602, various backgrounds may then be interposed in image 700 to train the machine learning object detection/recognition system. In various embodiments, a plurality of backgrounds (e.g., more than two, such as hundreds or thousands) may be interposed within various copies of image 700. Image 700 may be one such example of an object interposed within a background. Interposing a plurality of backgrounds allows for training of machine learning object detection/recognition system to detect and/or recognize the object in a plurality of backgrounds. FIG. 7 illustrates one such background.

In FIG. 7, a plurality of objects 702A-C may be interposed within image 700. Interposing a plurality of different objects 702A-C, instead of simply including one object in image 700, may further aid in training the machine learning object detection/recognition system to detect and/or recognize a specific object or that the object is present in an image. Additionally, interposing a plurality of objects within an image allows for training to detect the object in a typical retail environment (e.g., stacked on a shelf with other objects of the same type).

Further, the background of image 700 illustrates objects 702A-C placed on shelf 716 with dividers 714A and 714B, Items 710A-C and 712 as well as tags 718A-C may also be added to image 700. The addition of other items and typical features of retail environments such as tags 718A-C may further aid in training the machine learning object detection/recognition system. Additionally images and/or image sets may interpose the object in different backgrounds. Each of those images and/or image sets may be included as training data for the machine learning object detection/recognition system.

As such, the machine learning object detection/recognition system may be provided with training data depicting the object in a plurality (e.g., hundreds or thousands) of different scenes. Such backgrounds may be backgrounds already available and/or stored by the service provider and, as such, the user may not need to provide the background. Instead, backgrounds may be automatically provided and inserted into video data by the service provider. In certain embodiments, the background provided by the user within the image data may also be used as an additional background and/or added to a database of backgrounds that are then used for subsequent modifications of image data provided by the user or other users.

Figure 8:
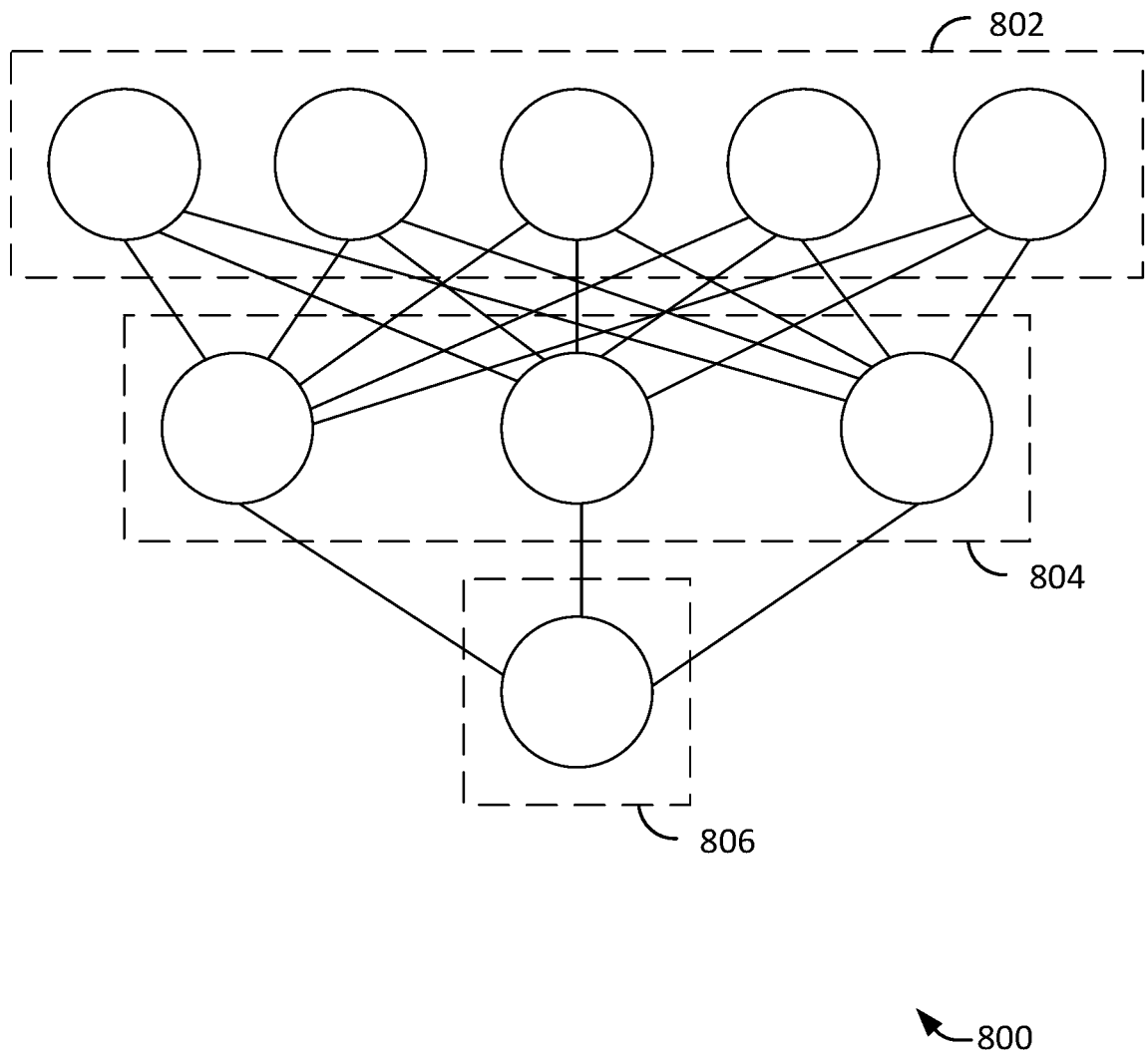
FIG. 8 illustrates an example configuration of a neural network, configured in accordance with one or more embodiments.

FIG. 8 illustrates an example configuration of a neural network, configured in accordance with one or more embodiments. FIG. 8 illustrates a neural network 800 that includes input layer 802, hidden layers 804, and output layer 806. Neural network 800 may be a machine learning network that may be trained to detect/recognize objects within images. Neural network 800 may be trained with image data as described herein. Input layer 802 may include inputs such as portions of an image or a plurality of images (e.g., frames of video data) provided by a user. Hidden layers 804 may be one or more intermediate layers where logic is performed to determine whether the image shows an object within the image. Output layer 806 may result from computation performed within hidden layers 804 and may output whether an object is detected within the image.

Figure 9:
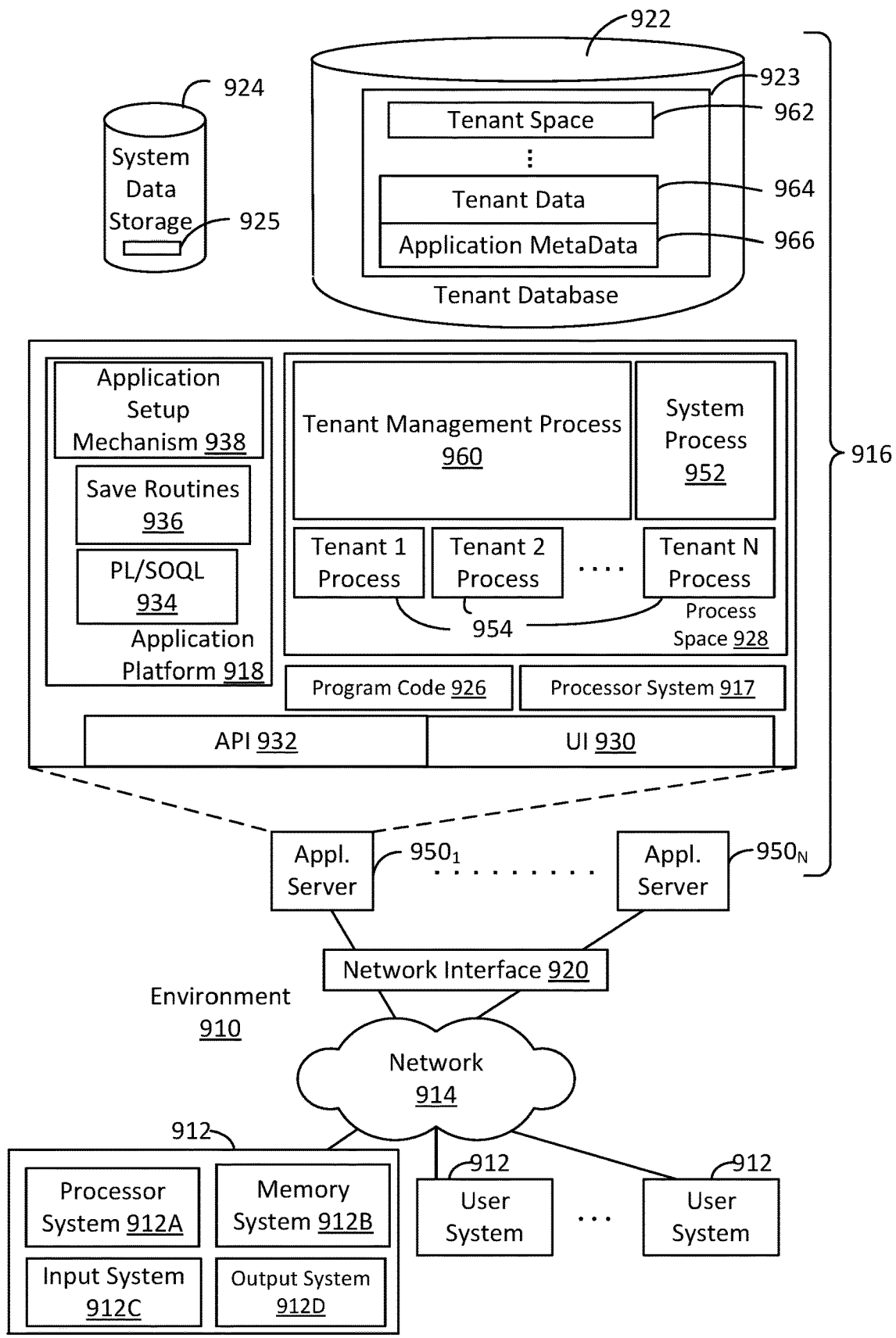
FIG. 9 shows a block diagram of an example of an environment that includes an on-demand database service, configured in accordance with some implementations.

FIG. 9 shows a block diagram of an example of an environment that includes an on-demand database service, configured in accordance with some implementations. FIG. 9 shows a block diagram of an example of an environment 910 that includes an on-demand database service configured in accordance with some implementations. Environment 910 may include user systems 912, network 914, database system 916, processor system 917, application platform 918, network interface 920, tenant data storage 922, tenant data 923, system data storage 924, system data 925, program code 926, process space 928, User Interface (UI) 930, Application Program Interface (API) 932, PL/SOQL 934, save routines 936, application setup mechanism 938, application servers 950-1 through 950-N, system process space 952, tenant process spaces 954, tenant management process space 960, tenant storage space 962, user storage 964, and application metadata 966. Some of such devices may be implemented using hardware or a combination of hardware and software and may be implemented on the same physical device or on different devices. Thus, terms such as "data processing apparatus," "machine," "server" and "device" as used herein are not limited to a single hardware device, but rather include any hardware and software configured to provide the described functionality.

An on-demand database service, implemented using system 916, may be managed by a database service provider. Some services may store information from one or more tenants into tables of a common database image to form a multi-tenant database system (MTS). As used herein, each MTS could include one or more logically and/or physically connected servers distributed locally or across one or more geographic locations. Databases described herein may be implemented as single databases, distributed databases, collections of distributed databases, or any other suitable database system. A database image may include one or more database objects. A relational database management system (RDBMS) or a similar system may execute storage and retrieval of information against these objects.

In some implementations, the application platform 18 may be a framework that allows the creation, management, and execution of applications in system 916. Such applications may be developed by the database service provider or by users or third-party application developers accessing the service. Application platform 918 includes an application setup mechanism 938 that supports application developers' creation and management of applications, which may be saved as metadata into tenant data storage 922 by save routines 936 for execution by subscribers as one or more tenant process spaces 954 managed by tenant management process 960 for example. Invocations to such applications may be coded using PL/SOQL 934 that provides a programming language style interface extension to API 932. A detailed description of some PL/SOQL language implementations is discussed in commonly assigned U.S. Pat. No. 7,730,478, titled METHOD AND SYSTEM FOR ALLOWING ACCESS TO DEVELOPED APPLICATIONS VIA A MULTI-TENANT ON-DEMAND DATABASE SERVICE, by Craig Weissman, issued on Jun. 1, 2010, and hereby incorporated by reference in its entirety and for all purposes. Invocations to applications may be detected by one or more system processes. Such system processes may manage retrieval of application metadata 966 for a subscriber making such an invocation. Such system processes may also manage execution of application metadata 966 as an application in a virtual machine.

In some implementations, each application server 950 may handle requests for any user associated with any organization. A load balancing function (e.g., an F5 Big-IP load balancer) may distribute requests to the application servers 950 based on an algorithm such as least-connections, round robin, observed response time, etc. Each application server 950 may be configured to communicate with tenant data storage 922 and the tenant data 923 therein, and system data storage 924 and the system data 925 therein to serve requests of user systems 912. The tenant data 923 may be divided into individual tenant storage spaces 962, which can be either a physical arrangement and/or a logical arrangement of data. Within each tenant storage space 962, user storage 964 and application metadata 966 may be similarly allocated for each user. For example, a copy of a user's most recently used (MRU) items might be stored to user storage 964. Similarly, a copy of MRU items for an entire tenant organization may be stored to tenant storage space 962. A UI 930 provides a user interface and an API 932 provides an application programming interface to system 916 resident processes to users and/or developers at user systems 912.

System 916 may implement a machine learning system as described herein. For example, in some implementations, system 916 may include application servers configured to implement and execute machine learning software applications. The application servers may be configured to provide related data, code, forms, web pages and other information to and from user systems 912. Additionally, the application servers may be configured to store information to, and retrieve information from a database system. Such information may include related data, objects, and/or Webpage content. With a multi-tenant system, data for multiple tenants may be stored in the same physical database object in tenant data storage 922, however, tenant data may be arranged in the storage medium(s) of tenant data storage 922 so that data of one tenant is kept logically separate from that of other tenants. In such a scheme, one tenant may not access another tenant's data, unless such data is expressly shared.

Several elements in the system shown in FIG. 9 include conventional, well-known elements that are explained only briefly here. For example, user system 912 may include processor system 912A, memory system 912B, input system 912C, and output system 912D. A user system 912 may be implemented as any computing device(s) or other data processing apparatus such as a mobile phone, laptop computer, tablet, desktop computer, or network of computing devices. User system 12 may run an internet browser allowing a user (e.g., a subscriber of an MTS) of user system 912 to access, process and view information, pages and applications available from system 916 over network 914. Network 914 may be any network or combination of networks of devices that communicate with one another, such as any one or any combination of a LAN (local area network), WAN (wide area network), wireless network, or other appropriate configuration.

The users of user systems 912 may differ in their respective capacities, and the capacity of a particular user system 912 to access information may be determined at least in part by "permissions" of the particular user system 912. As discussed herein, permissions generally govern access to computing resources such as data objects, components, and other entities of a computing system, such as a machine learning system, a social networking system, and/or a CRM database system. "Permission sets" generally refer to groups of permissions that may be assigned to users of such a computing environment. For instance, the assignments of users and permission sets may be stored in one or more databases of System 916. Thus, users may receive permission to access certain resources. A permission server in an on-demand database service environment can store criteria data regarding the types of users and permission sets to assign to each other. For example, a computing device can provide to the server data indicating an attribute of a user (e.g., geographic location, industry, role, level of experience, etc.) and particular permissions to be assigned to the users fitting the attributes. Permission sets meeting the criteria may be selected and assigned to the users. Moreover, permissions may appear in multiple permission sets. In this way, the users can gain access to the components of a system.

In some an on-demand database service environments, an Application Programming Interface (API) may be configured to expose a collection of permissions and their assignments to users through appropriate network-based services and architectures, for instance, using Simple Object Access Protocol (SOAP) Web Service and Representational State Transfer (REST) APIs.

In some implementations, a permission set may be presented to an administrator as a container of permissions. However, each permission in such a permission set may reside in a separate API object exposed in a shared API that has a child-parent relationship with the same permission set object. This allows a given permission set to scale to millions of permissions for a user while allowing a developer to take advantage of joins across the API objects to query, insert, update, and delete any permission across the millions of possible choices. This makes the API highly scalable, reliable, and efficient for developers to use.

In some implementations, a permission set API constructed using the techniques disclosed herein can provide scalable, reliable, and efficient mechanisms for a developer to create tools that manage a user's permissions across various sets of access controls and across types of users. Administrators who use this tooling can effectively reduce their time managing a user's rights, integrate with external systems, and report on rights for auditing and troubleshooting purposes. By way of example, different users may have different capabilities with regard to accessing and modifying application and database information, depending on a user's security or permission level, also called authorization. In systems with a hierarchical role model, users at one permission level may have access to applications, data, and database information accessible by a lower permission level user, but may not have access to certain applications, database information, and data accessible by a user at a higher permission level.

As discussed above, system 916 may provide on-demand database service to user systems 912 using an MTS arrangement. By way of example, one tenant organization may be a company that employs a sales force where each salesperson uses system 916 to manage their sales process. Thus, a user in such an organization may maintain contact data, leads data, customer follow-up data, performance data, goals and progress data, etc., all applicable to that user's personal sales process (e.g., in tenant data storage 922). In this arrangement, a user may manage his or her sales efforts and cycles from a variety of devices, since relevant data and applications to interact with (e.g., access, view, modify, report, transmit, calculate, etc.) such data may be maintained and accessed by any user system 912 having network access.

When implemented in an MTS arrangement, system 916 may separate and share data between users and at the organization-level in a variety of manners. For example, for certain types of data each user's data might be separate from other users' data regardless of the organization employing such users. Other data may be organization-wide data, which is shared or accessible by several users or potentially all users form a given tenant organization. Thus, some data structures managed by system 916 may be allocated at the tenant level while other data structures might be managed at the user level. Because an MTS might support multiple tenants including possible competitors, the MTS may have security protocols that keep data, applications, and application use separate. In addition to user-specific data and tenant-specific data, system 916 may also maintain system-level data usable by multiple tenants or other data. Such system-level data may include industry reports, news, postings, and the like that are sharable between tenant organizations.

In some implementations, user systems 912 may be client systems communicating with application servers 950 to request and update system-level and tenant-level data from system 916. By way of example, user systems 912 may send one or more queries requesting data of a database maintained in tenant data storage 922 and/or system data storage 924. An application server 950 of system 916 may automatically generate one or more SQL statements (e.g., one or more SQL queries) that are designed to access the requested data. System data storage 924 may generate query plans to access the requested data from the database.

The database systems described herein may be used for a variety of database applications. By way of example, each database can generally be viewed as a collection of objects, such as a set of logical tables, containing data fitted into predefined categories. A "table" is one representation of a data object, and may be used herein to simplify the conceptual description of objects and custom objects according to some implementations. It should be understood that "table" and "object" may be used interchangeably herein. Each table generally contains one or more data categories logically arranged as columns or fields in a viewable schema. Each row or record of a table contains an instance of data for each category defined by the fields. For example, a CRM database may include a table that describes a customer with fields for basic contact information such as name, address, phone number, fax number, etc. Another table might describe a purchase order, including fields for information such as customer, product, sale price, date, etc. In some multi-tenant database systems, standard entity tables might be provided for use by all tenants. For CRM database applications, such standard entities might include tables for case, account, contact, lead, and opportunity data objects, each containing pre-defined fields. It should be understood that the word "entity" may also be used interchangeably herein with "object" and "table".

In some implementations, tenants may be allowed to create and store custom objects, or they may be allowed to customize standard entities or objects, for example by creating custom fields for standard objects, including custom index fields. Commonly assigned U.S. Pat. No. 7,779,039, titled CUSTOM ENTITIES AND FIELDS IN A MULTI-TENANT DATABASE SYSTEM, by Weissman et al., issued on Aug. 17, 2010, and hereby incorporated by reference in its entirety and for all purposes, teaches systems and methods for creating custom objects as well as customizing standard objects in an MTS. In certain implementations, for example, all custom entity data rows may be stored in a single multi-tenant physical table, which may contain multiple logical tables per organization. It may be transparent to customers that their multiple "tables" are in fact stored in one large table or that their data may be stored in the same table as the data of other customers.

Figure 10A:
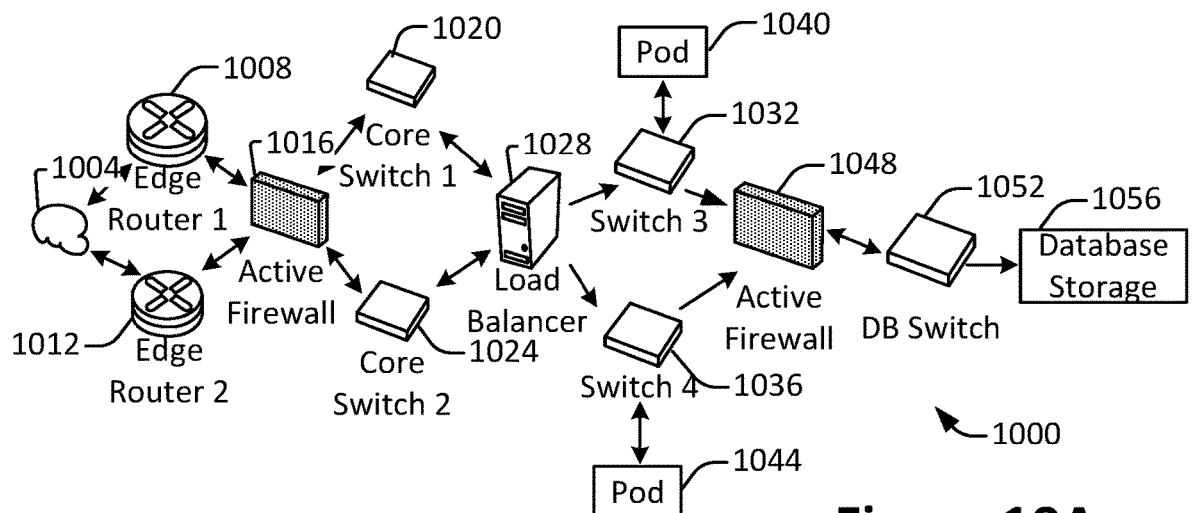
FIGS. 10A and 10B illustrate examples of a computing system, configured in accordance with one or more embodiments.
Figure 10B:
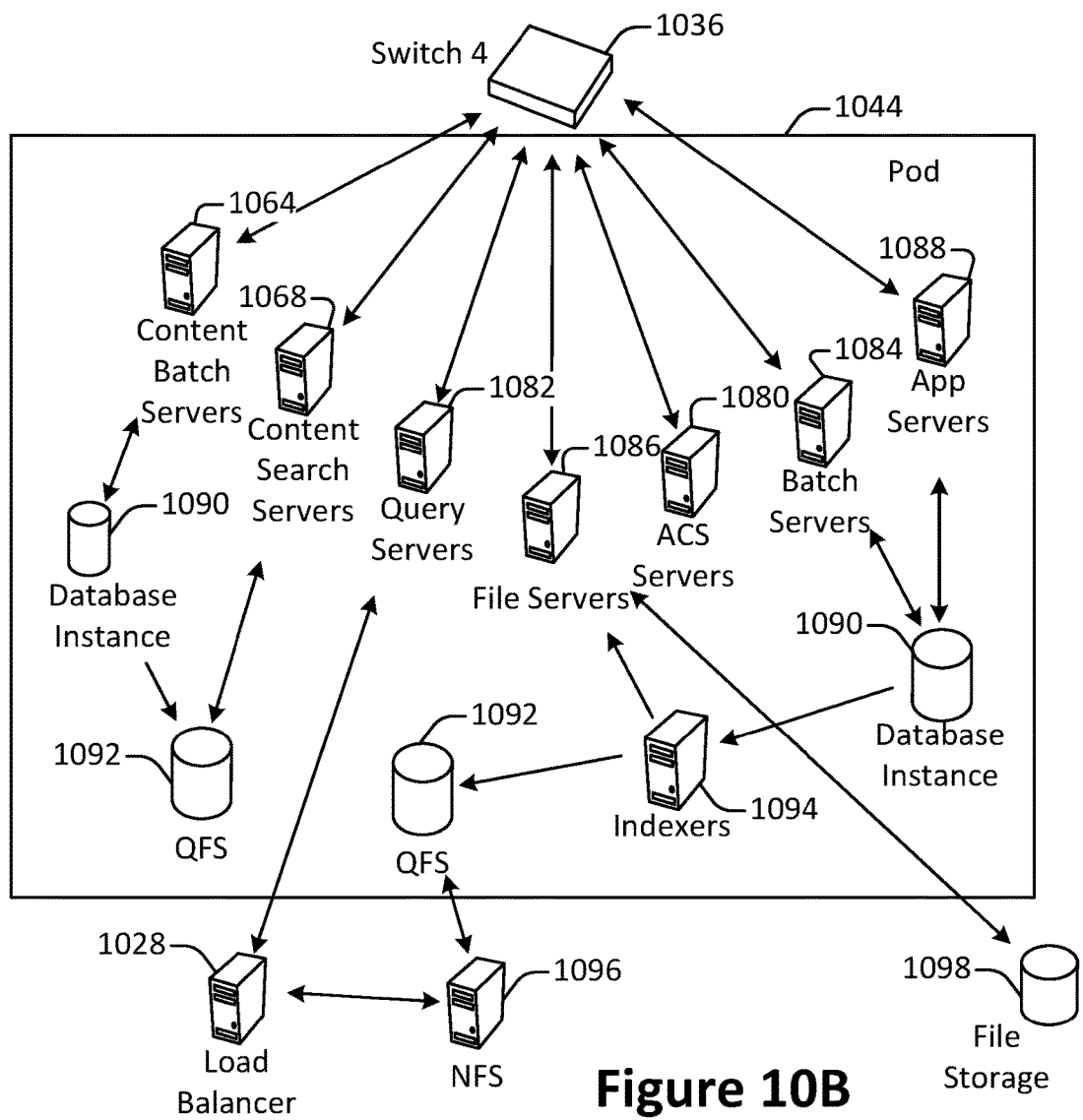

FIGS. 10A and 10B illustrate examples of a computing system, configured in accordance with one or more embodiments. FIG. 10A shows a system diagram of an example of architectural components of an on-demand database service environment 1000, configured in accordance with some implementations. A client machine located in the cloud 1004 may communicate with the on-demand database service environment via one or more edge routers 1008 and 1012. A client machine may include any of the examples of user systems ?12 described above. The edge routers 1008 and 1012 may communicate with one or more core switches 1020 and 1024 via firewall 1016. The core switches may communicate with a load balancer 1028, which may distribute server load over different pods, such as the pods 1040 and 1044 by communication via pod switches 1032 and 1036. The pods 1040 and 1044, which may each include one or more servers and/or other computing resources, may perform data processing and other operations used to provide on-demand services. Components of the environment may communicate with a database storage 1056 via a database firewall 1048 and a database switch 1052.

Accessing an on-demand database service environment may involve communications transmitted among a variety of different components. The environment 1000 is a simplified representation of an actual on-demand database service environment. For example, some implementations of an on-demand database service environment may include anywhere from one to many devices of each type. Additionally, an on-demand database service environment need not include each device shown, or may include additional devices not shown, in FIGS. 10A and 10B.

The cloud 1004 refers to any suitable data network or combination of data networks, which may include the Internet. Client machines located in the cloud 1004 may communicate with the on-demand database service environment 1000 to access services provided by the on-demand database service environment 1000. By way of example, client machines may access the on-demand database service environment 1000 to retrieve, store, edit, and/or process image data for product detection/recognition.

In some implementations, the edge routers 1008 and 1012 route packets between the cloud 1004 and other components of the on-demand database service environment 1000. The edge routers 1008 and 1012 may employ the Border Gateway Protocol (BGP). The edge routers 1008 and 1012 may maintain a table of IP networks or 'prefixes', which designate network reachability among autonomous systems on the internet.

In one or more implementations, the firewall 1016 may protect the inner components of the environment 1000 from internet traffic. The firewall 1016 may block, permit, or deny access to the inner components of the on-demand database service environment 1000 based upon a set of rules and/or other criteria. The firewall 1016 may act as one or more of a packet filter, an application gateway, a stateful filter, a proxy server, or any other type of firewall.

In some implementations, the core switches 1020 and 1024 may be high-capacity switches that transfer packets within the environment 1000. The core switches 1020 and 1024 may be configured as network bridges that quickly route data between different components within the on-demand database service environment. The use of two or more core switches 1020 and 1024 may provide redundancy and/or reduced latency.

In some implementations, communication between the pods 1040 and 1044 may be conducted via the pod switches 1032 and 1036. The pod switches 1032 and 1036 may facilitate communication between the pods 1040 and 1044 and client machines, for example via core switches 1020 and 1024. Also or alternatively, the pod switches 1032 and 1036 may facilitate communication between the pods 1040 and 1044 and the database storage 1056. The load balancer 1028 may distribute workload between the pods, which may assist in improving the use of resources, increasing throughput, reducing response times, and/or reducing overhead. The load balancer 1028 may include multilayer switches to analyze and forward traffic.

In some implementations, access to the database storage 1056 may be guarded by a database firewall 1048, which may act as a computer application firewall operating at the database application layer of a protocol stack. The database firewall 1048 may protect the database storage 1056 from application attacks such as structure query language (SQL) injection, database rootkits, and unauthorized information disclosure. The database firewall 1048 may include a host using one or more forms of reverse proxy services to proxy traffic before passing it to a gateway router and/or may inspect the contents of database traffic and block certain content or database requests. The database firewall 1048 may work on the SQL application level atop the TCP/IP stack, managing applications' connection to the database or SQL management interfaces as well as intercepting and enforcing packets traveling to or from a database network or application interface.

In some implementations, the database storage 1056 may be an on-demand database system shared by many different organizations. The on-demand database service may employ a single-tenant approach, a multi-tenant approach, a virtualized approach, or any other type of database approach. Communication with the database storage 1056 may be conducted via the database switch 1052. The database storage 1056 may include various software components for handling database queries. Accordingly, the database switch 1052 may direct database queries transmitted by other components of the environment (e.g., the pods 1040 and 1044) to the correct components within the database storage 1056.

FIG. 10B shows a system diagram further illustrating an example of architectural components of an on-demand database service environment, in accordance with some implementations. The pod 1044 may be used to render services to user(s) of the on-demand database service environment 1000. The pod 1044 may include one or more content batch servers 1064, content search servers 1068, query servers 1082, file servers 1086, access control system (ACS) servers 1080, batch servers 1084, and app servers 1088. Also, the pod 1044 may include database instances 1090, quick file systems (QFS) 1092, and indexers 1094. Some or all communication between the servers in the pod 1044 may be transmitted via the switch 1036.

In some implementations, the app servers 1088 may include a framework dedicated to the execution of procedures (e.g., programs, routines, scripts) for supporting the construction of applications provided by the on-demand database service environment 1000 via the pod 1044. One or more instances of the app server 1088 may be configured to execute all or a portion of the operations of the services described herein.

In some implementations, as discussed above, the pod 1044 may include one or more database instances 1090. A database instance 1090 may be configured as an MTS in which different organizations share access to the same database, using the techniques described above. Database information may be transmitted to the indexer 1094, which may provide an index of information available in the database 1090 to file servers 1086. The QFS 1092 or other suitable filesystem may serve as a rapid-access file system for storing and accessing information available within the pod 1044. The QFS 1092 may support volume management capabilities, allowing many disks to be grouped together into a file system. The QFS 1092 may communicate with the database instances 1090, content search servers 1068 and/or indexers 1094 to identify, retrieve, move, and/or update data stored in the network file systems (NFS) 1096 and/or other storage systems.

In some implementations, one or more query servers 1082 may communicate with the NFS 1096 to retrieve and/or update information stored outside of the pod 1044. The NFS 1096 may allow servers located in the pod 1044 to access information over a network in a manner similar to how local storage is accessed. Queries from the query servers 1022 may be transmitted to the NFS 1096 via the load balancer 1028, which may distribute resource requests over various resources available in the on-demand database service environment 1000. The NFS 1096 may also communicate with the QFS 1092 to update the information stored on the NFS 1096 and/or to provide information to the QFS 1092 for use by servers located within the pod 1044.

In some implementations, the content batch servers 1064 may handle requests internal to the pod 1044. These requests may be long-running and/or not tied to a particular customer, such as requests related to log mining, cleanup work, and maintenance tasks. The content search servers 1068 may provide query and indexer functions such as functions allowing users to search through content stored in the on-demand database service environment 1000. The file servers 1086 may manage requests for information stored in the file storage 1098, which may store information such as documents, images, basic large objects (BLOBS), etc. The query servers 1082 may be used to retrieve information from one or more file systems. For example, the query system 1082 may receive requests for information from the app servers 1088 and then transmit information queries to the NFS 1096 located outside the pod 1044. The ACS servers 1080 may control access to data, hardware resources, or software resources called upon to render services provided by the pod 1044. The batch servers 1084 may process batch jobs, which are used to run tasks at specified times. Thus, the batch servers 1084 may transmit instructions to other servers, such as the app servers 1088, to trigger the batch jobs.

While some of the disclosed implementations may be described with reference to a system having an application server providing a front end for an on-demand database service capable of supporting multiple tenants, the disclosed implementations are not limited to multi-tenant databases nor deployment on application servers. Some implementations may be practiced using various database architectures such as ORACLE®, DB2® by IBM and the like without departing from the scope of present disclosure.

Figure 11:
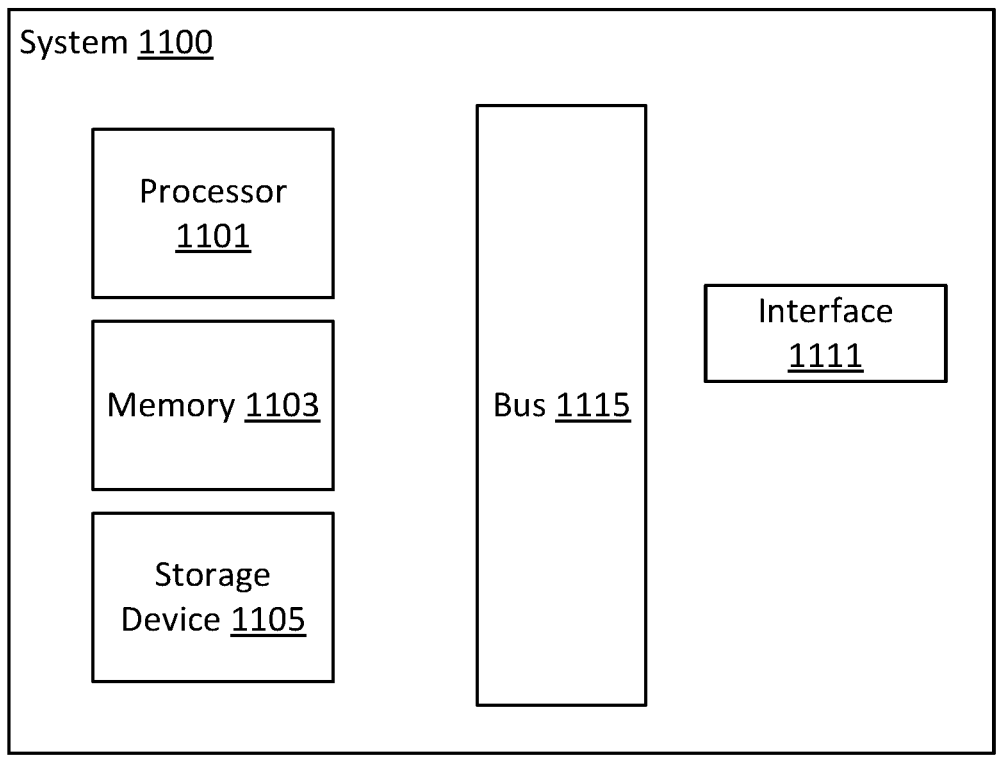
FIG. 11 illustrates one example of a computing device, configured in accordance with one or more embodiments.

FIG. 11 illustrates one example of a computing device, configured in accordance with one or more embodiments. FIG. 11 illustrates one example of a computing device. According to various embodiments, a system 1100 suitable for implementing embodiments described herein includes a processor 1101, a memory module 1103, a storage device 1105, an interface 1111, and a bus 1115 (e.g., a PCI bus or other interconnection fabric.) System 1100 may operate as variety of devices such as an application server, a database server, or any other device or service described herein. Although a particular configuration is described, a variety of alternative configurations are possible. The processor 1101 may perform operations such as those described herein. Instructions for performing such operations may be embodied in the memory 1103, on one or more non-transitory computer readable media, or on some other storage device. Various specially configured devices can also be used in place of or in addition to the processor 1101. The interface 1111 may be configured to send and receive data packets over a network. Examples of supported interfaces include, but are not limited to: Ethernet, fast Ethernet, Gigabit Ethernet, frame relay, cable, digital subscriber line (DSL), token ring, Asynchronous Transfer Mode (ATM), High-Speed Serial Interface (HSSI), and Fiber Distributed Data Interface (FDDI). These interfaces may include ports appropriate for communication with the appropriate media. They may also include an independent processor and/or volatile RAM. A computer system or computing device may include or communicate with a monitor, printer, or other suitable display for providing any of the results mentioned herein to a user.

Any of the disclosed implementations may be embodied in various types of hardware, software, firmware, computer readable media, and combinations thereof. For example, some techniques disclosed herein may be implemented, at least in part, by computer-readable media that include program instructions, state information, etc., for configuring a computing system to perform various services and operations described herein. Examples of program instructions include both machine code, such as produced by a compiler, and higher-level code that may be executed via an interpreter. Instructions may be embodied in any suitable language such as, for example, Apex, Java, Python, C++, C, HTML, any other markup language, JavaScript, ActiveX, VBScript, or Perl. Examples of computer-readable media include, but are not limited to: magnetic media such as hard disks and magnetic tape; optical media such as flash memory, compact disk (CD) or digital versatile disk (DVD); magneto-optical media; and other hardware devices such as read-only memory ("ROM") devices and random-access memory ("RAM") devices. A computer-readable medium may be any combination of such storage devices.

In the foregoing specification, various techniques and mechanisms may have been described in singular form for clarity. However, it should be noted that some embodiments include multiple iterations of a technique or multiple instantiations of a mechanism unless otherwise noted. For example, a system uses a processor in a variety of contexts but can use multiple processors while remaining within the scope of the present disclosure unless otherwise noted. Similarly, various techniques and mechanisms may have been described as including a connection between two entities. However, a connection does not necessarily mean a direct, unimpeded connection, as a variety of other entities (e.g., bridges, controllers, gateways, etc.) may reside between the two entities.

In the foregoing specification, reference was made in detail to specific embodiments including one or more of the best modes contemplated by the inventors. While various implementations have been described herein, it should be understood that they have been presented by way of example only, and not limitation. For example, some techniques and mechanisms are described herein in the context of on-demand computing environments that include MTSs. However, the techniques of disclosed herein apply to a wide variety of computing environments. Particular embodiments may be implemented without some or all of the specific details described herein. In other instances, well known process operations have not been described in detail in order to avoid unnecessarily obscuring the disclosed techniques. Accordingly, the breadth and scope of the present application should not be limited by any of the implementations described herein, but should be defined only in accordance with the claims and their equivalents.

The invention claimed is:

1. A computer-implemented method implemented in a machine learning environment, the method comprising:
    creating training data by modifying video data, the video data comprising a first plurality of frames, the video data modified to highlight a first object within a first plurality of frames, the modifying comprising:
        identifying first object pixels within the first plurality of frames of the video data;
        determining non-first object pixels within the first plurality of frames of the video data;
        creating first modified video data by replacing the non-first object pixels with first background pixels, while retaining the first object pixels, in the first plurality of frames of the video data; and
        creating second modified video data by replacing, in the first plurality of frames of the first modified video data, the first background pixels with second background pixels, while retaining the first object pixels; and
    providing the training data to a machine learning program, the training data comprising the second modified video data, wherein the training data is configured to train the machine learning program to identify the first object within an image.

2. The method of claim 1, wherein the training data comprises a plurality of sets of second modified video data, wherein each of the sets of the second modified video data highlights the first object.

3. The method of claim 2, wherein each of the sets of the second modified video data is modified to reflect different product placement and lighting conditions.

4. The method of claim 1, wherein the creating the second modified video data further comprises:
    constructing a bounding box around the first object pixels in each of the plurality of frames.

5. The method of claim 1,
    wherein the training data does not include the first modified video data.

6. The method of claim 1, further comprising:
    annotating the second modified video data to further highlight the first object within each of the plurality of frames.

7. The method of claim 6, wherein the annotating the video data comprises providing annotations in a secondary file.

8. The method of claim 1, wherein the first object within the video data is a three-dimensional computer aided design (CAD) object.

9. The method of claim 1, further comprising:
    transmitting instructions for obtaining the video data to a user device.

10. A computer program product comprising a non-transitory computer-readable medium storing computer-readable program code executed by one or more processors in an object detection environment to cause the one more processors to perform operations comprising:
    creating training data by modifying video data, the video data comprising a first plurality of frames, the video data modified to highlight a first object within a first plurality of frames, the modifying comprising:
        identifying first object pixels within the first plurality of frames of the video data;
        determining non-first object pixels within the first plurality of frames of the video data;
        creating first modified video data by replacing the non-first object pixels with first background pixels, while retaining the first object pixels, in the first plurality of frames of the video data; and
        creating second modified video data by replacing, in the first plurality of frames of the first modified video data, the first background pixels with second background pixels, while retaining the first object pixels; and
    providing the training data to a machine learning program, the training data comprising the second modified video data, wherein the training data is configured to train the machine learning program to identify the first object within an image.

11. The computer program product of claim 10, wherein the training data comprises a plurality of sets of second modified video data, wherein each of the sets of the second modified video data highlights the first object.

12. The computer program product of claim 10, wherein the creating the second modified video data further comprises:
constructing a bounding box around the first object pixels in each of the plurality of frames.

13. The computer program product of claim 10, wherein the training data does not include the first modified video data.

14. The computer program product of claim 10, wherein the operations further comprise:
annotating the second modified video data to further highlight the first object within each of the plurality of frames.

15. The computer program product of claim 10, wherein the first object within the video data is a three-dimensional computer aided design (CAD) object, and wherein the operations further comprise:
transmitting instructions for obtaining the video data to a user device.

16. The computer program product of claim 11, wherein each of the sets of the second modified video data is modified to reflect different product placement and lighting conditions.

17. The computer program product of claim 14, wherein the annotating the video data comprises providing annotations in a secondary file.

18. A computing system implemented using a server system implemented in an object detection environment, the computing system comprising:
a processor; and
a non-transitory memory comprising instructions stored thereon to cause execution of operations comprising:
creating training data by modifying video data, the video data comprising a first plurality of frames, the video data modified to highlight a first object within a first plurality of frames, the modifying comprising:
identifying first object pixels within the first plurality of frames of the video data;
determining non-first object pixels within the first plurality of frames of the video data;
creating first modified video data by replacing the non-first object pixels with first background pixels, while retaining the first object pixels, in the first plurality of frames of the video data; and
creating second modified video data by replacing, in the first plurality of frames of the first modified video data, the first background pixels with second background pixels, while retaining the first object pixels; and
providing the training data to a machine learning program, the training data comprising the second modified video data, wherein the training data is configured to train the machine learning program to identify the first object within an image.

19. The computing system of claim 18, wherein the training data comprises a plurality of sets of second modified video data, wherein each of the sets of the second modified video data highlights the first object.

20. The computing system of claim 19, wherein each of the sets of the second modified video data is modified to reflect different product placement and lighting conditions.

* * * * *